(12) United States Patent
Lemay

(10) Patent No.: US 6,297,708 B1
(45) Date of Patent: Oct. 2, 2001

(54) TEMPERATURE COMPENSATED HIGH PERFORMANCE OSCILLATOR

(75) Inventor: Normand T. Lemay, Minneapolis, MN (US)

(73) Assignee: Itron, Inc., Waseca, MN (US)

( * ) Notice: Subject to any disclaimer, the term of this patent is extended or adjusted under 35 U.S.C. 154(b) by 0 days.

(21) Appl. No.: 09/506,169

(22) Filed: Feb. 17, 2000

Related U.S. Application Data

(60) Provisional application No. 60/120,641, filed on Feb. 18, 1999.

(51) Int. Cl.[7] .................................................. H03B 5/00
(52) U.S. Cl. ................ 331/176; 331/117 R; 331/116 R; 331/156; 331/74; 331/34; 331/175
(58) Field of Search .................... 331/108 R, 34, 331/74, 176, 117 R, 175, 116 R, 158

(56) References Cited

U.S. PATENT DOCUMENTS

| | | | |
|---|---|---|---|
| 3,798,578 | 3/1974 | Konishi et al. ...................... 333/229 |
| 4,205,263 | 5/1980 | Kawagai et al. ...................... 323/317 |
| 4,565,979 | 1/1986 | Fiedziuszko ...................... 331/117 D |
| 4,570,132 | 2/1986 | Driscoll ................................. 331/56 |
| 4,593,256 | 6/1986 | Bickley ............................. 331/117 R |
| 4,639,690 | 1/1987 | Lewis ................................... 331/96 |
| 5,134,371 | 7/1992 | Watanabe et al. .................. 331/65 X |
| 5,166,647 | 11/1992 | Riebman .......................... 331/107 SL |
| 5,268,657 | 12/1993 | Estrick et al. .......................... 331/75 |
| 5,345,197 | * 9/1994 | Riggio, Jr. ....................... 331/117 R |
| 5,406,201 | 4/1995 | Kiryu et al. .......................... 324/248 |
| 5,604,467 | 2/1997 | Matthews .............................. 331/176 |

* cited by examiner

*Primary Examiner*—Arnold Kinkead
(74) *Attorney, Agent, or Firm*—Patterson, Thuente, Skaar & Christensen, P.A.

(57) ABSTRACT

The oscillator of the present invention generally comprises a resonating device that is directly coupled to ground and a circuit portion. The circuit portion is operably coupled to the resonating device and includes a first transistor and a second transistor. The first transistor provides DC feedback to the second transistor and enables a temperature independent bias current through said second transistor.

18 Claims, 2 Drawing Sheets

TEMPERATURE COMPENSATED HIGH PERFORMANCE OSCILLATOR

RELATED APPLICATION

The present application claims the benefit of U.S. Provisional Application No. 60/120,641, filed Feb. 18, 1999, incorporated herein by reference.

FIELD OF THE INVENTION

The present invention relates to oscillators, and more particularly, to oscillators that maintain a stabilized frequency over a large temperature range.

BACKGROUND OF THE INVENTION

Oscillators are used in numerous applications where it is desired to have an alternating current with a stable frequency. However, most oscillation circuits are subject to deviation from their nominal output frequency. These frequency deviations can be due to many sources including temperature variations, which can cause frequency drift, and load variations, which can cause frequency pulling.

In attempts to stabilize these frequency deviations, circuits have been developed which use biasing techniques to eliminate frequency drift and/or additional stages to reduce pulling. However, the biasing techniques tend to load down the resonator of the circuit and de-que its performance. Additional stages add to the overall cost and complexity of the oscillator circuit.

U.S. Pat. No. 5,126,699 describes the use of a temperature sensor whose reading is used by a temperature compensation algorithm within a microprocessor to determine what DC value should be added to modulation to maintain a desired oscillator frequency. Clearly, a temperature sensor and a microprocessor adds significant cost.

In view of the above, there is a need for an oscillator circuit that compensates for frequency drift and frequency pulling due to temperature variations and load variations, respectively, without adding significant cost or complexity to the circuit.

SUMMARY OF THE INVENTION

The needs described above are in large measure met by a temperature compensated high performance oscillator of the present invention. The oscillator of the present invention generally comprises a resonating device that is directly coupled to ground and a circuit portion. The circuit portion is operably coupled to the resonating device and includes a first transistor and a second transistor. The first transistor provides DC feedback to the second transistor and enables a temperature independent bias current through said second transistor.

The temperature independent bias current is achieved by utilizing substantially equivalent resistance on the collector and emitter legs of the first transistor. Note that the first transistor also operates as a high-gain output buffer to external loads. The output buffer enables the frequency of oscillation of the oscillator to be substantially independent of the external load. The resonating device may comprise a resonator or a high Q inductor. The direct connection of the resonating device to ground substantially maximizes the loaded Q of the oscillator.

DESCRIPTION OF THE PREFERRED EMBODIMENTS

Figure 1:
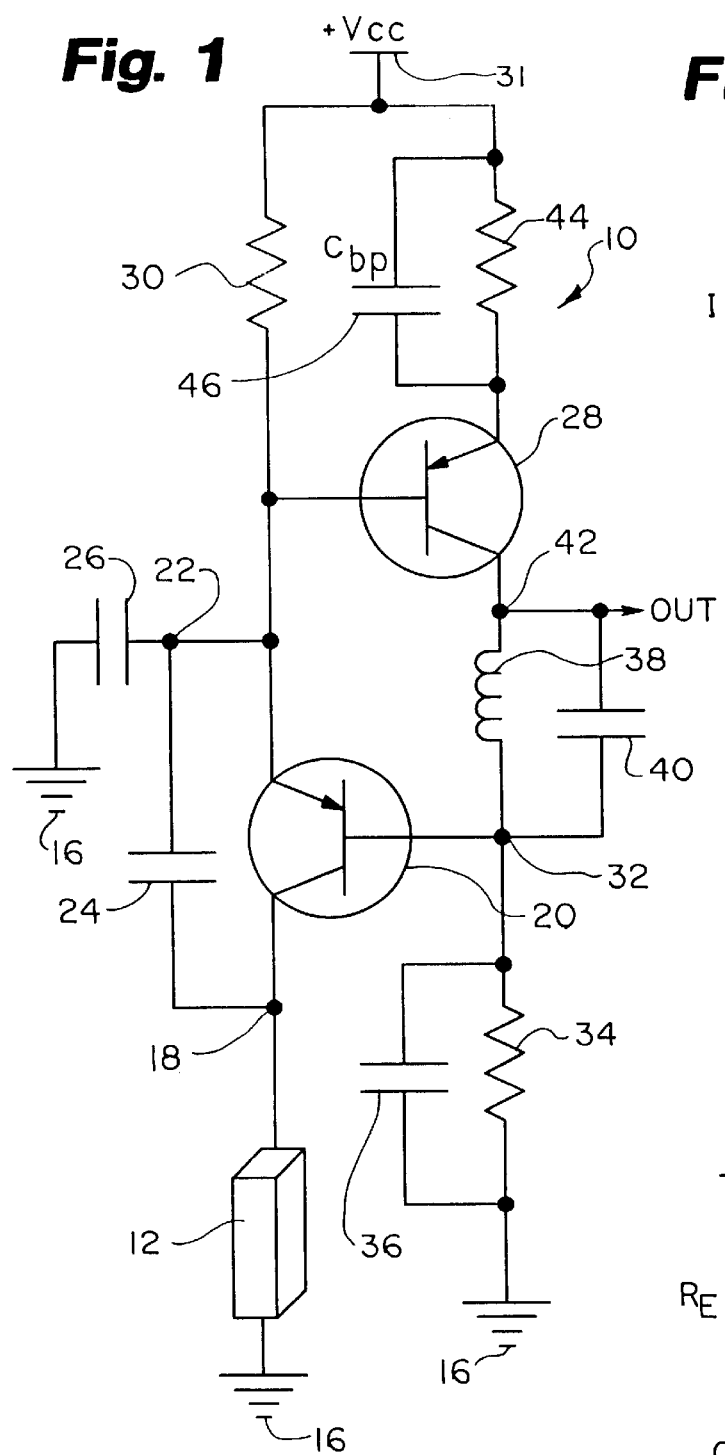
FIG. 1 is a schematic of an oscillator of the present invention

Referring to FIG. 1, an oscillator 10 of the present invention is depicted. Oscillator 10 is a high-performance oscillator having a high loaded Q, a substantially constant output power, minimal frequency pulling and minimal temperature drift.

As shown in FIG. 1, oscillator 10 includes a resonator 12, e.g., a high Q inductor or coaxial resonator, which is coupled directly to ground 16 and node 18. Node 18 is tied to the collector of a first PNP transistor 20. Connected between node 18 and a node 22 is a capacitor 24. A capacitor 26 is connected between node 22 and ground 16. Node 22 is connected to the emitter of transistor 20 and to the base of a second PNP transistor 28. A resistor 30 is connected between the base of transistor 28 and a positive voltage supply 31, $V_{CC}$, e.g., +5V. The base of transistor 20 is connected to node 32. The parallel combination of an inductor 38 and a capacitor 40 are connected between node 32 and a node 42. The parallel combination of a capacitor 36 and a resistor 34 are connected between node 36 and ground 16. The output of oscillator 10 is provided at node 42. Node 42 is connected to the collector of transistor 28. The parallel combination of a resistor 44 and a capacitor 46 are connected between the emitter of transistor 28 and positive voltage supply 31, $V_{CC}$. The preferred component values for oscillator 10 are provided below in Table 1, of course, other component values may be used without departing from the spirit or scope of the invention.

TABLE 1

| | |
|---|---|
| Capacitor 24 | 5.6 picoFarads |
| Capacitor 26 | 82 picoFarads |
| Capacitor 36, 46 | 1000 picoFarads |
| Capacitor 40 | 7.5 picoFarads |
| Resistor 30 | 500 Ohms |
| Resistor 34, 44 | 350 Ohms |
| Inductor 38 | 15 nanoHenries |

Upon application of a positive supply voltage, oscillator 10 operates as follows. Internal noise generated at the desired frequency of operation is amplified by transistor 20 and the output of transistor 20 is selectively fed back to the input of the same amplifier, i.e., transistor 20, exactly in phase (in order to satisfy the Barkhausen criteria of positive feedback with 0° of phase shift around a closed loop to sustain oscillations). The frequency selective network in the feedback path is composed of resonator 12 (an inductor may be used as well), and capacitors 24 and 26. Resistor 30 establishes the bias current amplitude over temperature and process variations when DC feedback is employed using transistor 28 as shown in FIG. 1. The PNP topology allows resonator 12 to be placed directly to ground without any biasing resistor in parallel which might de-que the performance of the ensuing resonant circuit. The remaining components comprise the DC feedback to the oscillator amplifier and provide an output buffer stage. The DC feedback and output buffer stage are described in further detail below.

The loaded Q of oscillator 10 is maximized by avoiding any bias resistance across resonator 12, i.e., resonator 12 is coupled directly to ground without an interceding bias resistor. The ability to avoid bias resistance is achieved by using a current bias circuit 50, shown in FIG. 2. The components comprising current bias circuit 50 are easily cross-referenced with oscillator 10 of FIG. 1, as like components use like item numbers. As such, current bias circuit 50, generally comprises the components of resistors 30, 34, and 44 and transistor 20 and 28. By using DC feedback with transistor 28, current bias circuit 50 can form a temperature independent bias current through transistor 20. This can be shown by the following analysis of current bias circuit 50. It should be noted that $I_{C20}$ is the current through the collector of transistor 20, as indicated, and that $I_{C28}$ is the current through the collector of transistor 28, as indicated.

Using standard circuit analysis techniques, $I_{C28}$ may approximately be defined as follows (assuming $\beta>>10$):

$$I_{C28} = \frac{V_{CC} - I_{C28}R_{44} - V_{be} - V_{be}}{R_{34}} \quad \text{Eq. (1)}$$

where: $V_{be}$ is the base-emitter voltage for each transistor. Combining common terms and solving for $I_{C28}$ yields:

$$I_{C28}R_{34} = V_{CC} - I_{28}R_{44} - 2V_{be} \quad \text{Eq. (2)}$$

$$I_{C28}R_{34} + I_{C28}R_{44} = V_{CC} - 2V_{be} \quad \text{Eq. (3)}$$

$$I_{C28}(R_{34} + R_{44}) = V_{CC} - 2V_{be} \quad \text{Eq. (4)}$$

Finally, $I_{C28}$ may be defined as:

$$I_{C28} = \frac{V_{CC} - 2V_{be}}{R_{34} + R_{44}} \quad \text{Eq. (5)}$$

Next, using standard circuit analysis techniques, the following equation may be written for $I_{C20}$:

$$I_{C20} = \frac{I_{C28}R_{44} + V_{be}}{R_{30}} \quad \text{Eq. (6)}$$

Substituting for $I_{C28}$ yields:

$$I_{C20} = \frac{\left(\frac{V_{CC} - 2V_{be}}{R_{34} + R_{44}}\right)R_{44} + V_{be}}{R_{30}} \quad \text{Eq. (7)}$$

Multiplying through yields:

$$I_{C20} = \frac{\frac{R_{44}V_{CC}}{R_{34} + R_{44}} - \frac{2V_{be}R_{44}}{R_{34} + R_{44}} + V_{be}}{R_{30}} \quad \text{Eq. (8)}$$

$$= \frac{R_{44}V_{CC} - 2V_{be}R_{44} + V_{be}(R_{34} + R_{44})}{(R_{34} + R_{44})R_{30}}$$

Temperature compensation Of $V_{be}$ for transistor 28 occurs when $R_{34}=R_{44}$, as such, Equation 8 may be rewritten as follows:

$$I_{C20} = \frac{\frac{R_{44}V_{CC}}{2R_{44}} - \frac{2V_{be}R_{44}}{2R_{44}} + V_{be}}{R_{30}} \quad \text{Eq. (9)}$$

$$= \frac{\frac{V_{CC}}{2} - V_{be} + V_{be}}{R_{30}}$$

Then, eliminating terms and combining common terms, $I_{C20}$ may be defined as follows:

$$I_{C20} = \frac{V_{CC}}{2R_{30}} \quad \text{Eq. (10)}$$

In view of equation 10, and referring once again to FIG. 1, it can be seen that the bias current through transistor 20 of oscillator 10 is set by the voltage, $V_{CC}$, provided by voltage source 31 and by the value of resistor 30; any variance in the bias current that might have been caused by the base-emitter voltage of transistor 28 has been virtually eliminated by setting resistors 34 and 44 equal to each other and by presuming, as indicated above, that the common-emitter gain, $\beta$, is high. If $\beta$ is not high, then $I_{C20}$ is defined by the following equation:

$$I_{C20} = \frac{\beta}{(\beta+1)^2} \cdot \left[\frac{V_{CC}(R_{44}(1+\beta) + R_{30}) + V_{be}[(R_{34}-R_{44})(\beta+1) - 2R_{30}]}{R_{30}(R_{44}+R_{34})}\right] \quad \text{Eq. (10a)}$$

Additional benefit of using DC feedback with transistor 28 is that it forces the output impedance at the collector of transistor 20 to be extremely high, thus, loading resonator 12 even less. The output impedance at the collector of transistor 20 may be determined by referring to FIGS. 3 and 4. The circuit of FIG. 3 describes the constant current source of FIG. 2 and provides a feedback factor, F, where F is a voltage controlled current source, $I_2$. Thus, F is defined as follows:

$$F = \frac{I_2}{V_2} = \frac{g_{m2}}{R_1 g_{m2} + 1} \quad \text{Eq. (11)}$$

Figure 2:
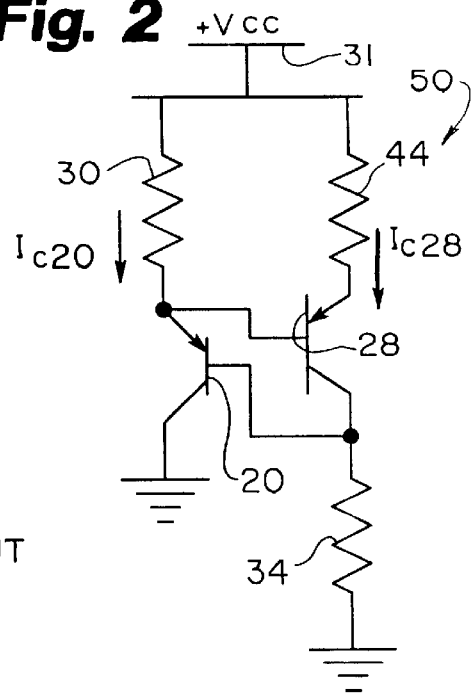
FIG. 2 is a schematic of a current bias circuit that is operable with the oscillator of the present invention.
Figure 3:
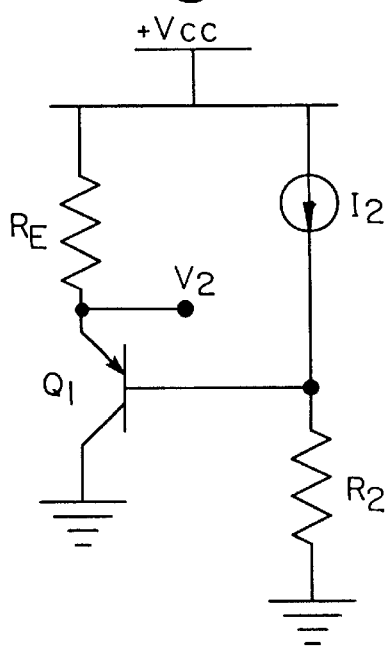
FIG. 3 is a simplified schematic of the current bias circuit of FIG. 2.
Figure 4:
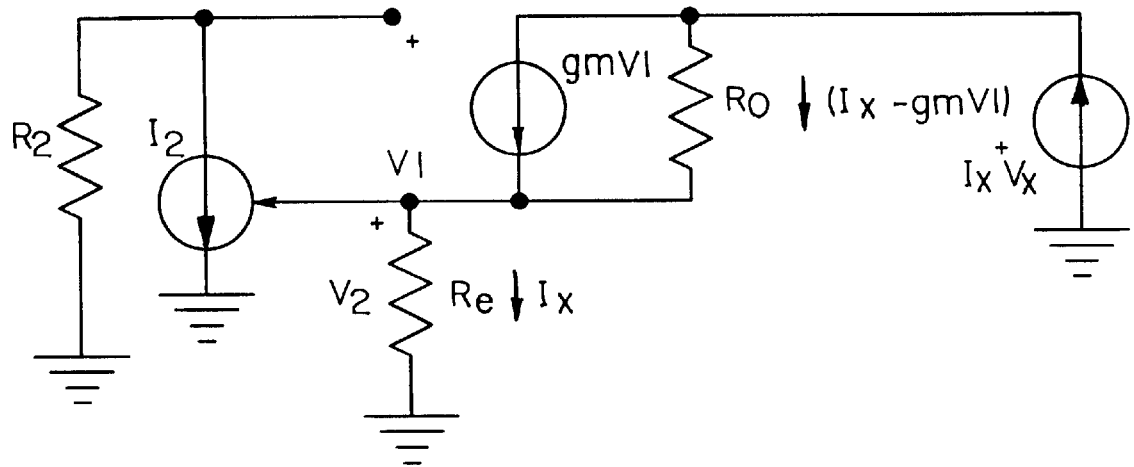
FIG. 4 is a small signal approximation of the current bias circuit of FIG. 2.

A small signal approximation of the current source of FIG. 2 is provided by FIG. 4. With reference to FIG. 4, equations for $V_1$, $V_2$, and $V_X$, can be written as follows:

$$V_2 = I_X R_e \quad \text{Eq. (12)}$$

To determine $V_1$:

$$V_1 + V_2 = -R_2 I_2 \quad \text{Eq. (13)}$$

Substituting $FV_2$ for $I_2$ yields:

$$V_1 + V_2 = -R_2 F V_2 \quad \text{Eq. (14)}$$

And, solving for $V_1$:

$$V_1 = -R_2 F V_2 - V_2 = -V_2(R_2 F + 1) \quad \text{Eq. (15)}$$

Then, substituting for $V_2$, $V_1$ is defined as follows:

$$V_1 = -I_X R_e(R_2 F + 1) \quad \text{Eq. (16)}$$

$V_X$ may be defined as follows:

$$V_X = R_O(I_X - g_m V_1) + R_e I_X \quad \text{Eq. (17)}$$

Multiplying through by $R_O$ yields:

$$V_X = R_O I_X - g_m V_1 R_O + R_e I_X \quad \text{Eq. (18)}$$

Then, substituting for $V_1$, $V_X$ is defined as:

$$V_X = R_O I_X + g_m R_O I_X R_e (R_2 F + 1) + R_e I_X \quad \text{Eq. (19)}$$

Finally, the output impedance, $Z_O$, may be defined as $V_X/I_X$, or:

$$Z_O = R_O + R_e + g_m R_O R_e (R_2 F + 1) \quad \text{Eq. (20)}$$

Substituting for F, equation 20 may be rewritten as:

$$Z_O = R_O + R_e + \frac{g_m R_O R_e R_2 g_{m2}}{R_1 g_{m2} + 1} \quad \text{Eq. (21)}$$

Thus, an approximation of output impedance may be written as:

$$Z_O \approx R_O + R_e + \frac{g_{m1} R_O R_e R_2}{R_1} \quad \text{Eq. (22)}$$

With respect to the item numbers of FIG. 2, the equation for output impedance is written as:

$$Z_O \approx R_{CE20} + R_{30} + \frac{g_{m20} R_{CE20} R_{30} R_{34}}{R_{44}} \quad \text{Eq. (23)}$$

Thus, in view of equation 23, it can be seen that the impedance at the collector of transistor 20 is very high.

Still another benefit of using DC feedback with transistor 28, is that transistor 28 may now be used as a common-emitter output buffer. The emitter of transistor 28 is AC shorted to ground via capacitor 46 and the collector of transistor 28 has a tuned output due to inductor 38 and capacitor 40, which still allows DC feedback to occur to transistor 20. The top of the tuned output is then bypassed to AC ground via capacitor 36. This network thus allows transistor 28 to have two functions in the oscillator circuit: (1) providing DC feedback to transistor 20 to allow constant output voltage, as described above; and, (2) providing a high gain output buffer to external loads.

The high gain output buffer provides isolation from resonator 12 since this stage samples the RF signal at a low impedance point (emitter of transistor 20). More specifically, the output buffer samples the oscillating signal by tapping into the feedback path of the oscillator at the emitter of transistor 20. The base of transistor 28 has a high impedance input and will not load down the signal at this feedback point since this impedance is order of magnitudes larger than the low impedance presented by the emitter of transistor 20. The combination of high gain and high input impedance provided by the buffer stage (realized with transistor 28) gives very high isolation to the oscillator stage from outside influences. This isolation substantially ensures that the frequency of oscillation is not dependent on external loads. Independence from external loads allows for minimal frequency pulling and constant output power since the biasing is virtually temperature independent.

Figure 5:
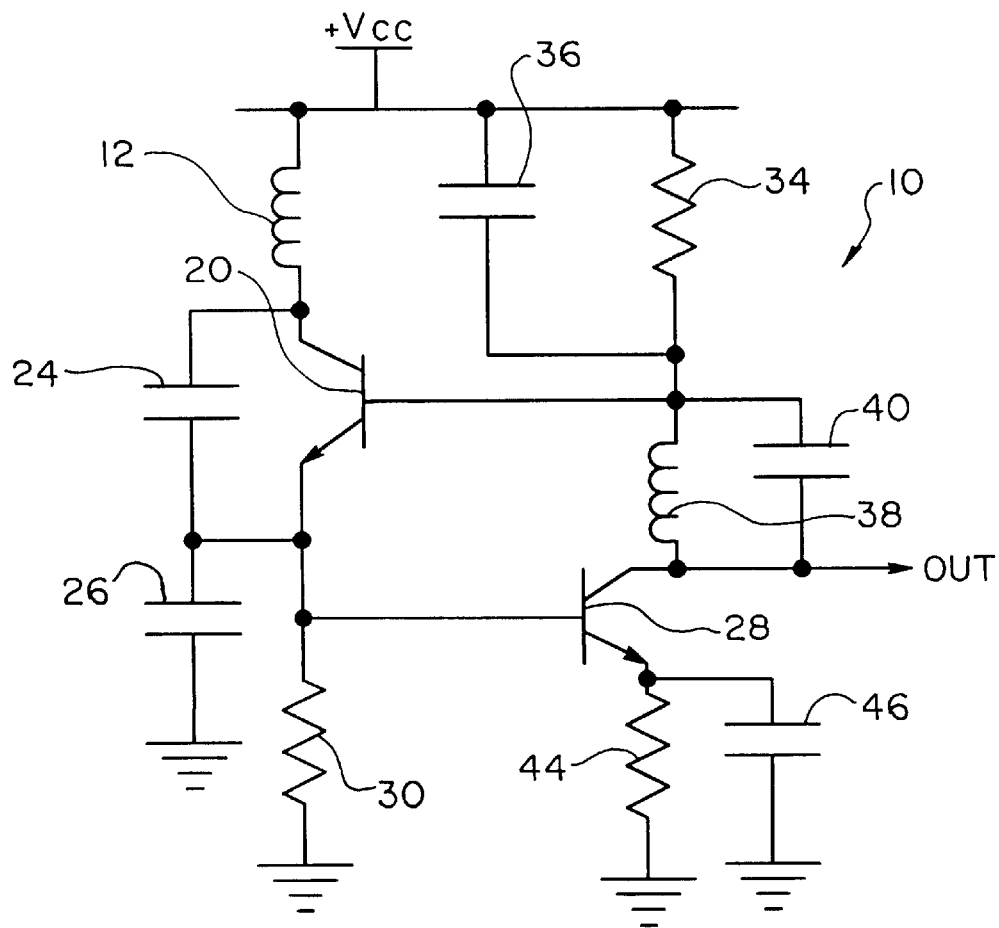
FIG. 5 is a schematic of an alternative embodiment of the oscillator of the present invention.

An alternative embodiment of the present invention is depicted in FIG. 5. Oscillator 100 of FIG. 5 is the dual of FIG. 1 where the component values are preferably the same as in FIG. 1 and the operation is substantially identical, however, NPN transistors are used in place of the PNP transistors of FIG. 1. NPN transistors may be desirable for higher frequency performance and/or as a matter of topological preference for the location of resonator 12 (referenced to supply or ground).

The present invention may be embodied in other specific forms without departing from the essential attributes thereof; therefore, the illustrated embodiments should be considered in all respects as illustrative and not restrictive, reference being made to the appended claims rather than to the foregoing description to indicate the scope of the invention.

What is claimed:

1. A temperature-compensated oscillator, comprising:
   a resonating device, wherein a resonator is directly coupled to a ground;
   a circuit portion operably coupled to said resonating device, wherein said circuit portion utilizes a first transistor and a second transistor, wherein said first transistor provides DC feedback to said second transistor, and wherein said DC feedback enables a temperature independent bias current through said second transistor, wherein said temperature independent bias current is achieved by utilizing substantially equivalent resistance on collector and emitter legs of the first transistor.

2. The oscillator of claim 1, wherein said first transistor operates as an output buffer to an external load.

3. The oscillator of claim 2, wherein said output buffer enables a frequency of oscillation of said oscillator to be substantially independent of said external load.

4. The oscillator of claim 2, wherein said output buffer is a high gain output buffer.

5. The oscillator of claim 1, wherein said resonating device is selected from a group consisting of: a coaxial resonator and a high Q inductor.

6. The oscillator of claim 1, wherein the coupling of said resonating device directly to ground enhances the loaded Q of the oscillator.

7. An oscillator, comprising:
   a resonating device; and
   a current biasing circuit that operates as a current source to said resonating device, wherein said current biasing circuit includes a biasing transistor and a direct current (DC) feedback transistor operably coupled to said biasing transistor, wherein a resistance on an emitter leg of said DC feedback transistor is substantially equivalent to a resistance on a collector leg of said DC feedback transistor.

8. The oscillator of claim 7, wherein the equivalence in resistance on the collector leg and emitter leg of said DC feedback transistor operates to cancel temperature effects experienced by said resonating device.

9. The oscillator of claim 7, wherein said DC feedback transistor operates as an output buffer amplifier.

10. The oscillator of claim 7, wherein said current biasing circuit provides a substantially constant current to said resonating device.

11. The oscillator of claim 7, wherein said current biasing circuit minimizes loading on said resonating device by forcing the output impedance at the collector of said biasing transistor high.

12. The oscillator of claim 7, wherein said resonating device is selected from a group consisting of a high Q inductor and a coaxial resonator.

13. A temperature compensated oscillator having an output voltage, comprising:

resonating means for providing a resonating signal;

temperature compensation means for substantially eliminating the effects of temperature on said resonating means so that said oscillator is provided with a substantially constant output voltage, wherein the effects of temperature are substantially eliminated by said temperature compensation means providing said resonating means with a substantially constant current source, wherein said substantially constant current source is achieved through via use of DC feedback and equivalent resistance.

14. The oscillator of claim 13, wherein said temperature compensation means for operating as an output buffer to an external load.

15. The oscillator of claim 14, wherein said output buffer enables a frequency of oscillation of said oscillator to be substantially independent of said external load.

16. The oscillator of claim 13, wherein said output buffer is a high gain output buffer.

17. The oscillator of claim 13, wherein said resonating means is selected from a group consisting of: a coaxial resonator and a high Q inductor.

18. The oscillator of claim 13, wherein said resonating means is directly coupled to a ground, the direct coupling enhancing the loaded Q of the oscillator.

* * * * *

UNITED STATES PATENT AND TRADEMARK OFFICE
CERTIFICATE OF CORRECTION

PATENT NO.    : 6,297,708 B1  
DATED         : October 2, 2001  
INVENTOR(S)   : Normand T. Lemay Page 1 of 1

It is certified that error appears in the above-identified patent and that said Letters Patent is hereby corrected as shown below:

Column 1,
Line 67, please add a "." following "invention".

Column 3,
Line 65, "Of" should be replaced with "of".

Column 4,
Line 34, should read "An additional...".

Column 6,
Line 25, please add "the" following "on".
Line 46, please add "the" in place of "an".
Line 48, should read -- the collector -- in place of "a collector".

Signed and Sealed this

Twenty-sixth Day of March, 2002

Attest:

*Attesting Officer*

JAMES E. ROGAN
*Director of the United States Patent and Trademark Office*